(12) United States Patent
Kim et al.

(10) Patent No.: US 10,535,797 B2
(45) Date of Patent: Jan. 14, 2020

(54) LIGHT EMITTING DIODE APPARATUS AND METHOD OF MANUFACTURING THE SAME

(71) Applicant: SAMSUNG ELECTRONICS CO., LTD., Suwon-si (KR)

(72) Inventors: Jae-seok Kim, Seoul (KR); Jin-hee Kang, Yongin-si (KR); Ji-hoon Kang, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/879,554

(22) Filed: Jan. 25, 2018

(65) Prior Publication Data

US 2019/0074406 A1 Mar. 7, 2019

(30) Foreign Application Priority Data

Sep. 1, 2017 (KR) .................. 10-2017-0112086

(51) Int. Cl.
*H01L 33/08* (2010.01)
*H01L 33/38* (2010.01)
(Continued)

(52) U.S. Cl.
CPC ............ *H01L 33/08* (2013.01); *H01L 33/382* (2013.01); *H01L 33/46* (2013.01); *H01L 33/007* (2013.01);
(Continued)

(58) Field of Classification Search
CPC ....... H01L 33/08; H01L 33/20; H01L 33/382; H01L 33/46; H01L 33/62; H01L 33/007; H01L 33/60
See application file for complete search history.

(56) References Cited

U.S. PATENT DOCUMENTS

| 6,897,489 B1 | 5/2005 | Peng et al. |
| 2004/0171245 A1 | 9/2004 | Gottfried |

(Continued)

FOREIGN PATENT DOCUMENTS

| JP | 2013-258177 A | 12/2013 |
| KR | 10-1272705 B1 | 6/2013 |

OTHER PUBLICATIONS

International Search Report dated Dec. 27, 2018 issued by the International Searching Authority in counterpart International Application No. PCT/KR2018/009954 (PCT/ISA/210).

(Continued)

*Primary Examiner* — William F Kraig
*Assistant Examiner* — Vicki B. Booker
(74) *Attorney, Agent, or Firm* — Sughrue Mion, PLLC

(57) ABSTRACT

A method of manufacturing a light emitting diode is provided. The method includes forming a semiconductor layer on a substrate, forming a mask layer including a plurality of grooves on the semiconductor layer, forming a plurality of nanostructures in the plurality of grooves, respectively, forming an etched region by etching an outer region of the semiconductor layer and an inner region of the semiconductor layer different from the outer region, forming a first electrode on the etched region of the semiconductor layer, forming an insulation layer on the first electrode, and forming a second electrode on the insulation layer and the plurality of nanostructures.

15 Claims, 13 Drawing Sheets

(51) Int. Cl.
    *H01L 33/46*     (2010.01)
    *H01L 33/00*     (2010.01)
    *H01L 33/20*     (2010.01)
    *H01L 33/60*     (2010.01)
    *H01L 33/62*     (2010.01)

(52) U.S. Cl.
    CPC .............. *H01L 33/20* (2013.01); *H01L 33/60* (2013.01); *H01L 33/62* (2013.01)

(56) References Cited

U.S. PATENT DOCUMENTS

| | | |
|---|---|---|
| 2005/0133806 A1 | 6/2005 | Peng et al. |
| 2007/0126013 A1 | 6/2007 | Kim et al. |
| 2013/0187193 A1 | 7/2013 | Lopez et al. |
| 2013/0221399 A1 | 8/2013 | Seo et al. |
| 2013/0328097 A1 | 12/2013 | Nakada et al. |
| 2013/0330862 A1 | 12/2013 | Zhu et al. |
| 2016/0163922 A1 | 6/2016 | Yoo et al. |
| 2016/0322537 A1 | 11/2016 | Miller |
| 2018/0204977 A1* | 7/2018 | Dheeraj .......... H01L 31/035227 |

OTHER PUBLICATIONS

Written Opinion dated Dec. 27, 2018 issued by the International Searching Authority in counterpart International Application No. PCT/KR2018/009954 (PCT/ISA/237).

* cited by examiner

LIGHT EMITTING DIODE APPARATUS AND METHOD OF MANUFACTURING THE SAME

CROSS-REFERENCE TO RELATED APPLICATION

This application claims priority from Korean Patent Application No. 10-2017-0112086, filed in the Korean Intellectual Property Office on Sep. 1, 2017, and the disclosure of which is incorporated herein by reference in its entirety.

BACKGROUND

1. Field

Apparatuses and methods consistent with the present disclosure relate to a light emitting diode and a method of manufacturing the same, and more particularly, to a light emitting diode including a nanostructure and a method of manufacturing the same.

2. Description of Related Art

Light emitting diodes (LEDs) have the advantages of long lifetime, low power consumption, and fast response speed, and are thus used in various display devices and lighting devices. In recent years, a light emitting diode including a nanostructure has been used to increase the light emitting area.

However, in the related art light emitting diode, the n-electrode and the p-electrode, which supply electrons and holes, respectively, are biased to one region in the light emitting diode, and thus the luminous efficiency decreases exponentially as the distance from the n-electrode and the p-electrode increases. In addition, a local heating phenomenon occurs around the place where the electrode is located.

Such a problem is referred to as a current crowding effect, and there is a demand for developing a light emitting diode for improving the current crowding effect as the arrangement and structure of the electrodes in the light emitting diode are changed.

SUMMARY

According to an aspect of an example embodiment, there is provided a method of manufacturing a light emitting diode, the method comprising: forming a semiconductor layer on a substrate; forming a mask layer including a plurality of grooves on the semiconductor layer; forming a plurality of nanostructures in the plurality of grooves, respectively; forming an etched region by etching an outer region of the semiconductor layer and an inner region of the semiconductor layer different from the outer region; forming a first electrode on the etched region of the semiconductor layer; forming an insulation layer on the first electrode; and forming a second electrode on the insulation layer and the plurality of nano structures.

The inner region may comprise at least one of a horizontal line region and vertical line region which is connected to the outer region while passing through a center portion of a region other than the outer region.

The inner region may comprise a rectangular region having four sides longer than a width of the horizontal line region and the vertical line region based on the center portion.

Each of the plurality of nanostructures may comprise: a nano-shaped n-type semiconductor layer; an active layer formed on the nano-shaped n-type semiconductor layer; and a p-type semiconductor layer formed on the active layer.

The active layer may be formed to cover the nano-shaped n-type semiconductor layer, and the p-type semiconductor layer may be formed to cover the active layer.

The method may further comprise: forming a reflective layer on the second electrode.

The method may further comprises: forming a first via hole on the substrate to connect with at least a portion of the first electrode formed in the outer region; forming a first pad in the first via hole; forming a second via hole in the substrate to connect with at least an outer portion of the second electrode; and forming a second pad within the second via hole.

An area of the insulation layer may be larger than or equal to an area of the first electrode.

The second electrode may cover the insulation layer and the plurality of nanostructures.

According to an aspect of another example embodiment, there is provided a light emitting diode, comprising: a substrate; a first n-type semiconductor layer formed on the substrate; a first electrode formed in an outer region of the first n-type semiconductor layer and formed in an inner region of the first n-type semiconductor layer different from the outer region; a plurality of nano-shaped second n-type semiconductors formed in at least a portion of the first n-type semiconductor layer other than an area in which the first electrode is formed in the first n-type semiconductor layer; a plurality of active layers formed on the plurality of nano-shaped second n-type semiconductors; a plurality of p-type semiconductors formed on the plurality of active layers; an insulation layer formed on the first electrode; and a second electrode formed on the insulation layer and the plurality of p-type semiconductors.

An active layer among the plurality of active layers may be formed on each of the plurality of nano-shaped n-type semiconductors, and a p-type semiconductor among the plurality of p-type semiconductors may be formed on each of the plurality of active layers.

The second electrode may cover the insulation layer and the plurality of p-type semiconductors.

The inner region may comprise at least one of a horizontal line region and a vertical line region which is connected to the outer region by passing through a center portion of a region other than the outer region.

The inner region may comprise a rectangular region having four sides longer than a width of the horizontal line region and the vertical line region based on the center portion.

The plurality of active layers may be formed to cover each of the plurality of nano-shaped n-type semiconductors, and the plurality of p-type semiconductors may be formed to cover each of the plurality of active layers.

The light emitting diode may further comprise: a mask layer which is formed between the plurality of nano-shaped n-type semiconductors.

The light emitting diode may further comprise: a reflective layer which is formed on the second electrode.

The light emitting diode may further comprise: a first pad which is formed in a first via hole of the substrate that is formed to connect with at least a portion of the first electrode formed in the outer region; and a second pad which is formed in a second via hole of the substrate that is formed to connect with at least an outer portion of the second electrode.

An area of the insulation layer may be larger than or equal to an area of the first electrode.

According to an aspect of another example embodiment, there is provided a light emitting diode, comprising: a semiconductor layer formed on a substrate; a plurality of mask elements formed on the semiconductor layer, the plurality of mask elements spaced apart from each other to form a plurality of openings; a plurality of nanostructures formed in the plurality of openings, respectively; a first electrode formed in an etched region of the semiconductor layer, the etched region comprising an outer region of the semiconductor layer and formed in an inner region inside a boundary formed by the outer region; an insulation layer formed on the first electrode; and a second electrode formed on the insulation layer and the plurality of nanostructures.

BRIEF DESCRIPTION OF THE DRAWINGS

The above and/or other aspects will become more apparent by reference to example embodiments which are illustrated in the appended drawings. These drawings depict only example embodiments and are not therefore to be considered to be limiting of the scope of the disclosure. Moreover, the principles herein are described and explained with additional specificity and detail via the use of the accompanying drawings, in which.

DETAILED DESCRIPTION

Figure 1A:
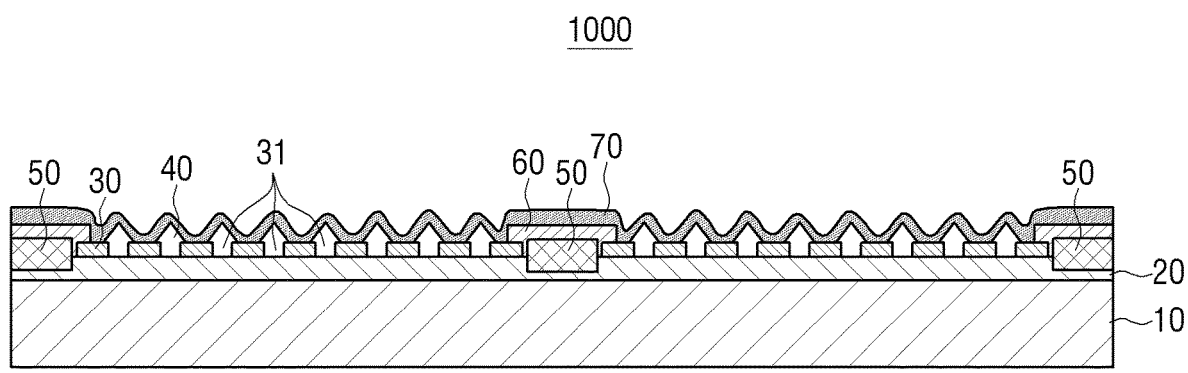
FIGS. 1A and 1B are diagrams illustrating a light emitting diode (LED) 1000, according to an example embodiment.

Specific example embodiments are illustrated in the drawings and are described in detail in the detailed description. However, it is to be understood that the present disclosure is not limited to a specific example embodiment, but includes all modifications, equivalents, and substitutions without departing from the scope and spirit of the present disclosure. In relation to explanation of the drawings, same or similar drawing reference numerals may be used for similar constituent elements.

It will be understood that when an element (for example, a first element) is "(operatively or communicatively) coupled with/to" or "connected with" another element (for example, a second element), the element may be directly coupled with/to another element, and there may be an intervening element (for example, a third element) between the element and another element. To the contrary, it will be understood that when an element (for example, a first element) is "directly coupled with/to" or "directly connected to" another element (for example, a second element), there is no intervening element (for example, a third element) between the element and another element.

The terms used in various example embodiments of the present disclosure are just for the purpose of describing particular example embodiments and are not intended to limit the present disclosure. In addition, the singular expression does not limit the present disclosure to have a single component or step. Instead, the present disclosure may comprise multiple components or steps even if described in singular expression. All of the terms used herein including technical or scientific terms have the same meanings as those generally understood by an ordinary skilled person in the related art unless they are defined otherwise. The terms defined in a generally used dictionary should be interpreted as having the same meanings as the contextual meanings of the relevant technology and should not be interpreted as having ideal or exaggerated meanings unless they are clearly defined in the various example embodiments. According to circumstances, even the terms defined in the example embodiments should not be interpreted as excluding the example embodiments of the present disclosure.

Hereinafter, various example embodiments of the present disclosure will be described in detail with reference to the accompanying drawings.

FIG. 1A is a diagram illustrating a light emitting diode (LED) 1000, according to an example embodiment.

Referring to FIG. 1A, a light emitting diode 1000 includes a substrate 10, a first semiconductor layer 20, a nanostructure 40, a first electrode 50, a second electrode 70, and an insulation layer 60.

The substrate 10 may be a substrate for semiconductor growth capable of growing a semiconductor material on the upper surface thereof. Specifically, the substrate 10 may be a template substrate on which any one of a sapphire substrate, a silicon (Si) substrate, a zinc oxide (ZnO) substrate, a nitride semiconductor substrate and GaN, InGaN, AlGaN and AlInGaN is laminated. As an example, the substrate 10 may be a sapphire substrate to grow a nitride layer having a hexagonal crystal system. However, the example is not limited thereto, and the substrate may be a metal substrate made of metallic materials such as Cu, Cr, Ni, Ag, Au, Mo, Pd, W, Al, or the like. Hereinbelow, for convenience of explanation, it will be assumed that the substrate is made of a sapphire substrate.

According to an example embodiment, a light extraction structure may be formed on a surface of the substrate 10 so that a light efficiency is enhanced. According to an example embodiment, the light extraction structure may include an uneven pattern having at least two periods that are different from each other.

The first semiconductor layer 20 may be formed on the substrate 10. According to an example embodiment, the first semiconductor layer 20 may be a nitride-based semiconductor layer, and may be a semiconductor layer made of at least one of GaN, InAlGaN, AlGaN, InGaN, AlN, InN and AlInN. As an example, the first semiconductor layer 20 may be n-GaN doped with n-type. However, the example is not limited thereto, and the first semiconductor layer 20 may be made of a p-type semiconductor layer doped with p-type as described below.

A mask layer 30 may be formed on the first semiconductor layer 20 according to an example embodiment. The mask layer 30 may be composed of silicon oxide or silicon nitride, and may, for example, be made of at least one of $SiO_x$, $SiO_xN_y$, $Si_xN_y$, $Al_2O_3$, TiN, AlN, ZrO, TiAlN and TiSiN. In particular, the mask layer 30 may be a distributed Bragg reflector (DBR) layer or an omni-directional reflector (ODR). According to an example embodiment, the mask layer 30 may have a structure in which layers having different refractive indices are alternately repeated and disposed. However, the example is not limited thereto, and the mask layer 30 may be a monolayer consisting of at least one of SiO, SiON, SiN, $Al_2O_3$, TiN, AlN, ZrO, TiAlN and TiSiN.

According to an example embodiment, the mask layer 30 may include a plurality of grooves from each a portion of the first semiconductor layer 20 is exposed. According to an example embodiment, a diameter, length, position and growth condition of the nanostructure 40, which will be described later, may be determined according to sizes of the plurality of grooves 31. As an example, each of the plurality of grooves 31 may have various shapes such as rectangle, circle, and the like.

Figure 1B:
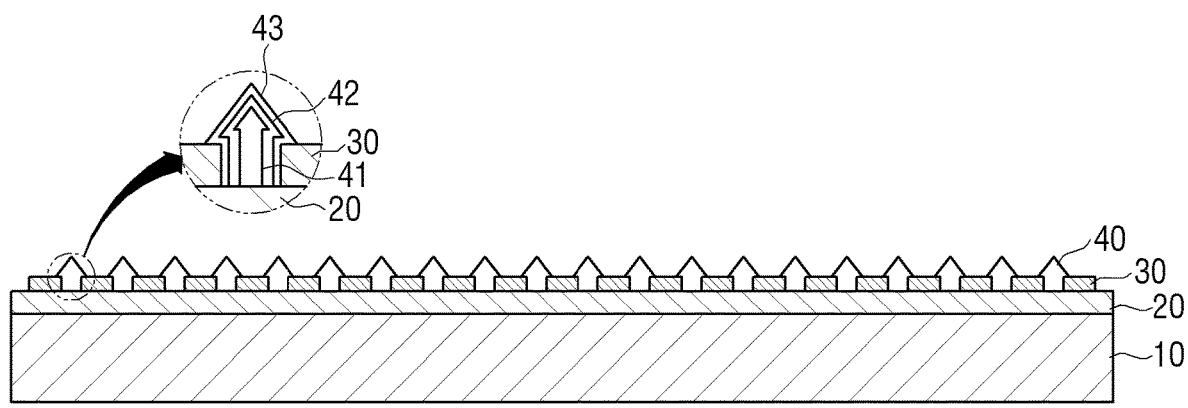

Referring to FIG. 1B, The nanostructure 40 may be formed in each of the plurality of grooves. According to an example embodiment, the nanostructure 40 may include a plurality of nano-shaped second semiconductors 41 grown from the first semiconductor layer 20, a plurality of active layers 42 formed in each of the plurality of second semiconductors 41 and a plurality of third semiconductors 43 formed in each of the plurality of active layers. For example, the nanostructure 40 may have a core-shell structure including a second semiconductor that is grown from an area of the first semiconductor layer 20 exposed from the mask layer 30 by a plurality of grooves 31, an active layer 42 sequentially formed on a surface of the second semiconductor 41, and a third semiconductor 43 sequentially formed on a surface of the active layer 42.

According to an example embodiment, the first semiconductor layer 20 and the second semiconductor 41 may be made of the same material. For example, when the first semiconductor layer 20 is an n-type semiconductor doped with n-type, the second semiconductor 41 may be an n-type semiconductor which is grown from an area of the first semiconductor layer 20, and the third semiconductor 43 may be a p-type semiconductor doped with p-type. However, the example is not limited thereto, and conversely, the first semiconductor layer 20 and the second semiconductor 41 may be p-type semiconductors, and the third semiconductor 43 may be formed of an n-type semiconductor. Hereinafter, it will be assumed that the first semiconductor layer 20 and the second semiconductor 41 are p-type semiconductors, and that the third semiconductor 43 is an n-type semiconductor for convenience of explanation. In addition, it will be assumed that the first semiconductor layer 20 is a first n-type semiconductor layer, that the second semiconductor 41 is a second n-type semiconductor, and that the third semiconductor 43 is a p-type semiconductor.

In addition, the second n-type semiconductor 41, the active layer 42 and the third p-type semiconductor 43 included in the nanostructure 40 may not necessarily be formed of a core-shell structure, and it may have a stacking structure in which the second n-type semiconductor 41, the active layer 42 and the third p-type semiconductor 43 are sequentially formed. A nanostructure may be pyramidical, cylindrical and circular. Since the nanostructure has a three-dimensional shape, the light emission surface area increases relative to the related art two-dimensional shape, so that the light extraction efficiency may be improved.

A first electrode 50 may be electrically connected with a first n-type semiconductor layer 20. As the first electrode 50 is electrically connected with the first n-type semiconductor layer 20, the electric charge may be input to the first n-type semiconductor layer 20 and the second n-type semiconductor 41.

In an example embodiment, a portion of the first n-type semiconductor layer 20 is etched after the first n-type semiconductor layer 20, the mask layer 30 and the nanostructure 40 are formed on the substrate 10, and the first electrode 50 may be formed at the etched position. For example, an outer region of a light emitting diode and a region other than the outer region may be etched so that a portion of an upper part of the first n-type semiconductor layer 20 is exposed. As an example, the etched and exposed region may have a depth of about 1-3 μm. The outer region may refer to a rectangular region when the light emitting diode is viewed from above. In addition, the region other than the outer region may refer to the remaining region excluding the outer region when the light emitting diode is viewed from above. As an example, it may refer to a horizontal line region and a vertical line region in which a region overlaps with a center part of an inner region inside the rectangular outer region when the light emitting diode is viewed from above. According to an example embodiment, the horizontal line region and the vertical line region connected to the outer region through the center of the outer region and the inner region may be etched, and the first electrode 50 may be formed at the etched position. More specific explanation thereof will be made hereinafter with reference to FIGS. 2D and 3.

An insulation layer 60 may be formed on the first electrode 50. As will be described later, the insulation layer 60 may be formed to electrically insulate the second electrode 70 electrically connected with the third semiconductor included in the nanostructure 40 and the first electrode 50. For example, the insulation layer 60 may be formed of polyimide, $SiN_x$, and the like.

For example, the insulation layer 60 may be shaped to cover the first electrode 50 positioned in an outer region and a region other than the outer region, and may have an area that is larger than or equal to an area of the first electrode 50. Accordingly, the first electrode 50 and the second electrode 70 are electrically insulated so that an electrical shorting phenomenon that may occur due to the connection between the first electrode 50 and the second electrode 70 may be prevented.

The second electrode 70 is electrically connected with a p-type semiconductor 43 included in the nanostructure 40. For example, the second electrode 70 may cover an upper surface and side surface of the nanostructure 40, and may be formed such that adjacent nanostructures 40 are connected with each other. The second electrode 70 may, for example, be Indium tin Oxide (ITO), Aluminum Zinc Oxide (AZO), Indium Zinc Oxide (IZO), ZnO, ZnO:Ga (GZO), $In_2O_3$, $SnO_2$, CdO, $CdSnO_4$, or $Ga_2O_3$. In addition, the second electrode 70 may be referred to as a transparent electrode or a transparent electrode layer, but will be referred to as the second electrode 70 below, for convenience of explanation.

As the second electrode 70 is electrically connected with the p-type semiconductor 43, a hole may be injected into the p-type semiconductor 43. As described above, as the first electrode 50 is electrically connected with the first n-type semiconductor layer 20, an electric charge is injected into the first n-type semiconductor layer 20 and the second n-type semiconductor layer 41, and when a hole is injected into the p-type semiconductor 43, an active layer positioned between the second n-type semiconductor 41 and the p-type semiconductor layer 43 may emit light having a predetermined energy by the recombination of the electron and the hole. According to an example embodiment, the active layer 420 may be a layer composed of a single material such as InGaN or the like, but may have a GaN/InGaN structure in the case of a single or multiple quantum well (MQW) structure in which a quantum barrier layer and a quantum well layer are alternately arranged, A method for manufacturing the present light emitting diode 1000 will be described below with reference to FIGS. 2A to 2G.

The terms "deposit" and "stack" which will be used below refer to forming a semiconductive material layer, and a layer or film which are formed though the various example embodiments of the present disclosure may be deposited in a growing chamber by using a metal-organic chemical vapor deposition (MOCVD) method or a molecular beam epitaxy (MBE) method, and may be formed by means of depositing by various methods, such as a PECVD, APCVD, LPCVD, UHCVD, PVD, an electronic beam method, a resistance heating method, and the like.

Figure 2A:
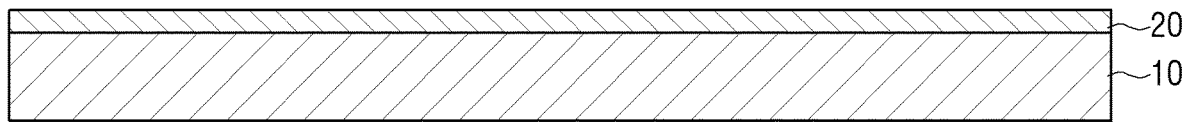
FIGS. 2A to 2G are diagrams illustrating a method of manufacturing an LED, according to an example embodiment.

FIGS. 2A to 2G are diagrams illustrating a manufacturing process of a light emitting diode, according to an example embodiment. As illustrated in FIG. 2A, a substrate 10 may be prepared and a first n-type semiconductor layer 20 (or first n-type semiconductor base layer) may be grown on the substrate 10.

The first n-type semiconductor layer 20 may provide a growth surface for growing a mask layer 30 and a nanostructure 40, and may be a structure for electrically connecting with a second n-type semiconductor 41 included in the nanostructure 40. Accordingly, the first n-type semiconductor layer 20 may be formed of semiconductor monocrystalline having electrical conductivity, and in this case, the substrate 10 may be a substrate for crystalline growth.

Figure 2B:
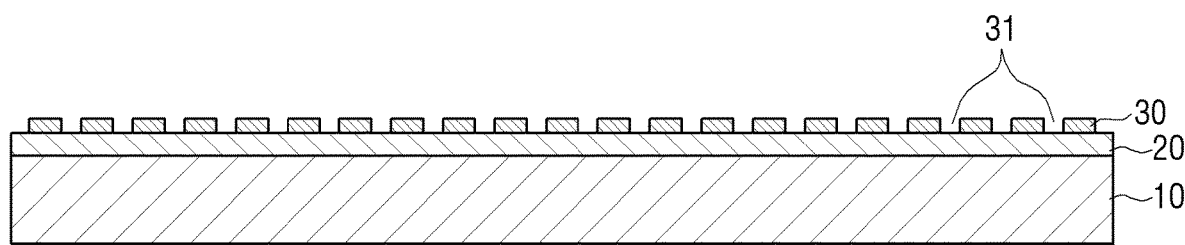

Next, as illustrated in FIG. 2B, a mask layer 30 may be formed on a first n-type semiconductor layer 20 provided in FIG. 2A. The mask layer 30 may include a plurality of grooves 31.

As an example, a mask layer 30 including a plurality of grooves 31 may be formed by forming a mold layer including a mask pattern on a predetermined base layer to provide a mask layer 30 and patterning the base layer according to the mask pattern of the mold layer. According to an example embodiment, the sizes of the plurality of grooves 31 may be constant, and thereafter the sizes of the plurality of grooves 31 may be determined based on the size of the nanostructure 40 to be formed in each of the plurality of grooves 31.

Figure 2C:
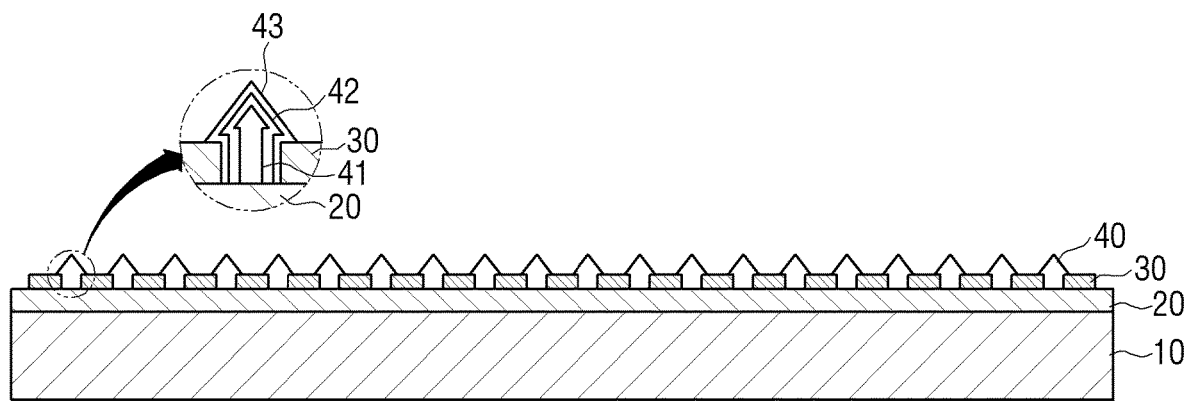

Referring to FIG. 2C, a nanostructure 40 may be formed in a plurality of grooves 31. For example, although not illustrated, a second n-type semiconductor 41 may be grown and formed on the first n-type semiconductor layer 20 which is exposed in the plurality of grooves 31 of the mask layer 30. As described above, the second n-type semiconductor 41 may be an n-type nitride semiconductor, which may be composed of the same material as the first n-type semiconductor layer 20. The second n-type semiconductor layer 41 may be formed using a metal organic chemical vapor deposition (MOCVD) process or a molecular beam epitaxy (MBE) process. In addition, an active layer 42 may be formed on the second n-type semiconductor 41, and a p-type semiconductor 43 may be formed on the active layer 42. In an example embodiment, as illustrated in FIG. 2C, the second n-type semiconductor 41, the active layer 42 and the p-type semiconductor 43 included in the nanostructure 40 may have a core-shell structure. Depending on the deposition method, the active layer 42 and the p-type semiconductor 43 may be deposited with different thicknesses from the second n-type semiconductor 41. In another example embodiment, it may have a structure a deposition structure in which the second n-type semiconductor 41, the active layer 42, and the p-type semiconductor 43 are sequentially formed, rather than the core-shell structure.

Figure 2D:
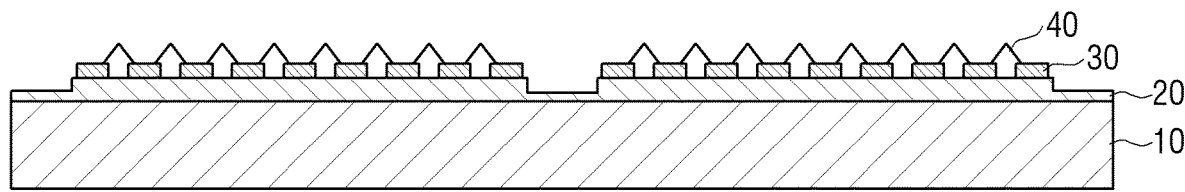

Thereafter, as illustrated in FIG. 2D, a structure provided in a region on the substrate 10 may be etched to provide a region for forming a first electrode. For example, the nanostructure 40, mask layer 30 and first n-type semiconductor layer 20 provided in a region on the substrate 10 may be etched in a mesa structure. According to an example embodiment, the first n-type semiconductor layer 20 may be etched only to a predetermined depth so that a portion of the first n-type semiconductor layer 20 remains. In other words, it may be etched so that a substrate 10 provided on a lower portion of the first n-type semiconductor layer 20 is not exposed, but is not limited thereto. For example, a patterning process may be various processes such as a photolithography process, imprinting process, or the like. In addition, an etching process may include processing, such as wet etching using chemicals, dry etching including plasma etching using reactive gas, reactive ion etching (RIE) using ion bombardment effect, and the like, and laser ablation using laser.

According to an example embodiment, the etched region may include a first region and a second region different from the first region. The first region may be an outer region of the first n-type semiconductor layer 20 and the second region may be a region other than the outer region. The first region may refer to an outer region having a rectangular shape when the first n-type semiconductor layer 20 or the light emitting diode 1000 is viewed from above. According to an example embodiment, the first region may refer to an outer region formed at a periphery of the semiconductor structure of the emitting diode 1000. In addition, the second region other than the first region may refer to a region from among the remaining region other than the outer region described above. According to an example embodiment, the second region may be formed in an inner region that is inside a boundary formed by the outer region. For example, at least one region from among the horizontal line region and the vertical line region that passes through a center portion of the inner region may correspond to the second region other than the first region, and the corresponding region may be etched along with the first region. In addition, the corresponding second region may have a structure to be connected with the first region. In other words, a region of the inner region (i.e., the horizontal region and the vertical line region) other than the outer region may be etched together, and a first electrode may be formed in the etched region.

Figure 2E:
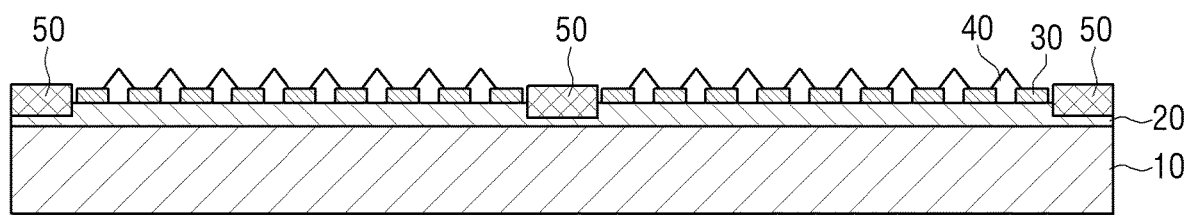

As illustrated in FIG. 2D, when a portion of the first n-type semiconductor layer 20 is etched, as illustrated in FIG. 2E, a first electrode 50 may be formed in the etched region. In other words, the first electrode 50 may be formed in one of the outer region and inner region of the first n-type semiconductor layer 20.

In related art light emitting diode, the first electrode 50 is positioned only in the outer region. As a result, charges are easily injected into to the first n-type semiconductor layer 20 and second n-type semiconductor 41 positioned in a periphery of the outer area, and the charge injection decreases exponentially as the distance from the outer region increases. However, as described according to one or more example embodiments of the present disclosure, when one of the inner region is etched to have a structure of being connected to the outer region and a first electrode 50 is formed in the etched area, the charge injection through the first electrode 50 is not concentrated in a specific one of the first n-type semiconductor layer 20 and the second n-type semiconductor 41. Specific effects, for example, the effect of increasing the luminous efficiency, will be described in more detail in FIG. 6B.

Figure 2F:
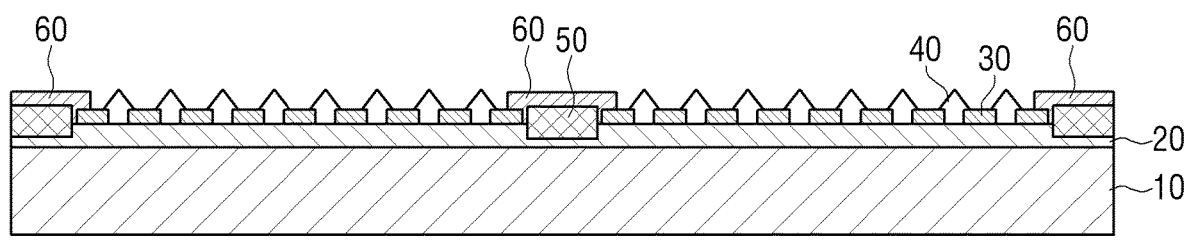

Thereafter, as illustrated in FIG. 2F, an insulation layer 60 may be formed on the first electrode 50. Specifically, the insulation layer 60 is a structure for electrically insulating the first electrode 50 and the second electrode 70 and thus may be formed in a region in which the first electrode 50 is formed. In an example embodiment, the insulation layer 60 may have an area larger or smaller than an area of the first electrode 50, and may have a structure covering upper and side surfaces of the first electrode 50.

In addition, in an example embodiment, the insulation layer 60 may be formed as a substance having a larger bandgap energy than the active layer 42, and may, for example, include AlGaN or AlInGaN.

Figure 2G:
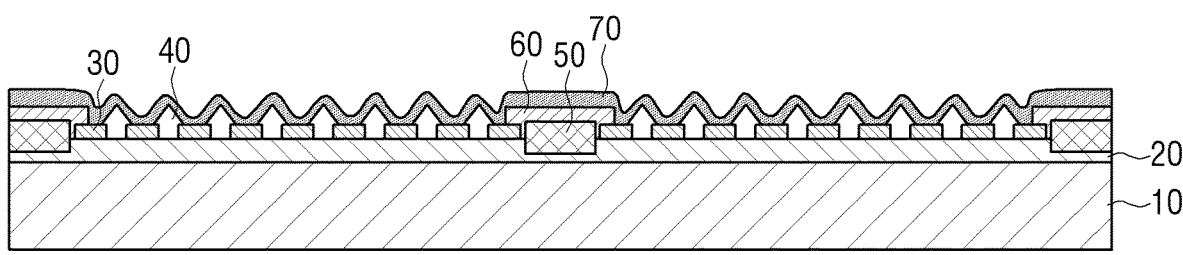

Thereafter, as illustrated in FIG. 2G, a second electrode 70 may be formed on the p-type semiconductor 43 included in the nanostructure 40. For example, the second electrode 70 may be extended to cover the upper surface of the mask layer 30 and the upper surface of the p-type semiconductor 43 between adjacent nanostructures 40, and thus may be formed as a layer on a plurality of nanostructures 40.

An example in which the first region (i.e., an outer region) and the second region (i.e., an inner region other than the outer region) of the first n-type semiconductor layer 20 are etched and a first electrode 50 is formed in the etched region will be described in detail below.

Figure 3:
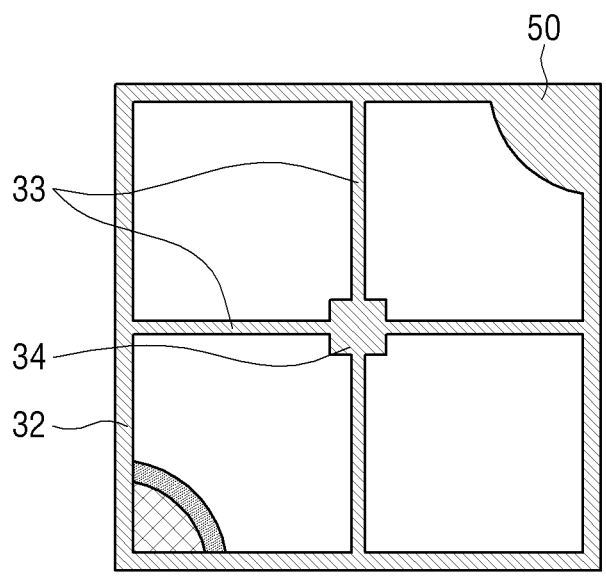
FIG. 3 is a bottom view illustrating an LED, according to an example embodiment.

FIG. 3 is a bottom view illustrating an LED, according to an example embodiment.

Referring to FIG. 3, an outer region 32 and an inner region 33 other than the outer region 32 of the first n-type semiconductor layer 20 are etched, and a first electrode 50 may formed in the etched region. For example, an inner region 33 other than the outer region 32 may be a horizontal line region and vertical line region which are connected to the outer region by passing through the center portion 34 of the inner region 33. For example, as illustrated in FIG. 3, an outer region 32 of the first n-type semiconductor layer 20, that is, outer region 32, may be etched and a first electrode 50 may be formed in the etched region. In addition, an inner region 33 other than the outer region 32 may be etched as well. According to an example embodiment, the etched inner region may be connected with the etched outer region. However, as illustrated in FIG. 3, a width and shape of the horizontal line region and the vertical line region are merely exemplary, and the example is not limited thereto. For example, the first n-type semiconductor layer 20 may be etched so that only one of the horizontal line and vertical line regions are formed, and a first electrode may be etched in the etched region.

In addition, a region other than the outer region according to an example embodiment may include a rectangular region having four sides longer than the width of the horizontal line and the vertical line based on the center portion. As illustrated in FIG. 3, the region in which the first n-type semiconductor layer 20 of the central portion of the inner region is etched and a first electrode 50 is formed may be relatively wider than the width of the horizontal line and the vertical line. This is due to the yield in the process, and it is not necessary that the rectangular region should necessarily be located at the center as shown in FIG. 3, and one region of the inner region may be etched in various shapes and the first electrode may be formed in the etched region.

Figure 4A:
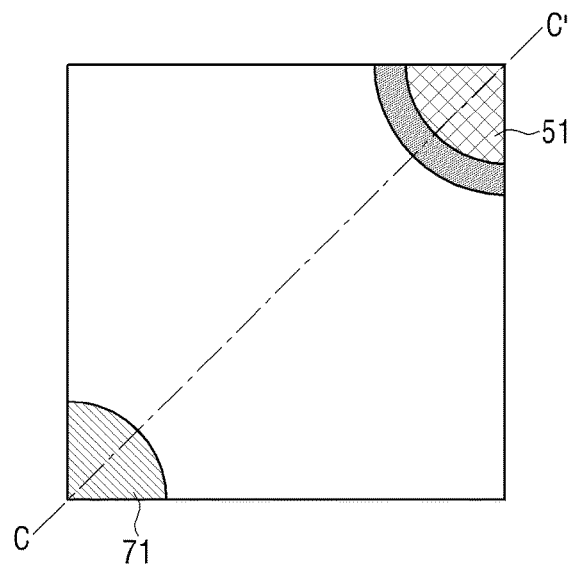
FIGS. 4A and 4B are diagrams illustrating the case where an LED is a flip chip structure, according to an example embodiment.
Figure 4B:
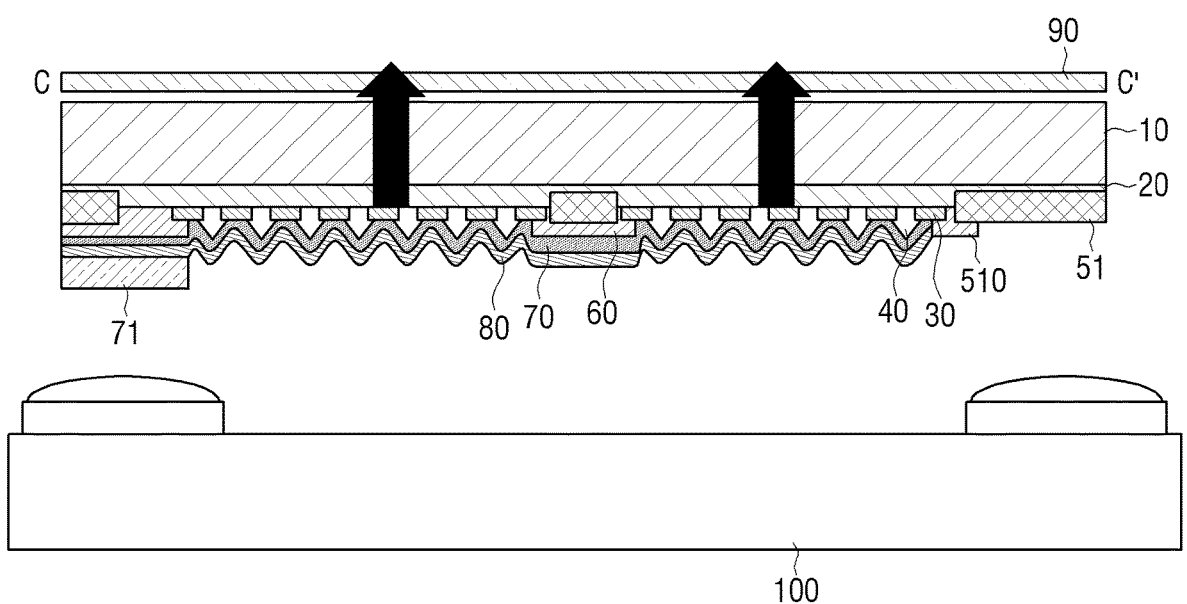

FIGS. 4A and 4B are diagrams illustrating the case where an LED is a flip chip structure, according to an example embodiment.

As illustrated in FIG. 4B, a flipchip bonding may be used to package a light emitting diode 1000. According to an example embodiment, the flipchip bonding may refer to a process of forming bumps on the first and second electrodes of the LED 1000 and then mounting the light emitting diode 1000 on the package substrate 100 in a solder or thermal sonic fashion with the LED 1000 facing downward (i.e., bottom emission method).

Referring to FIG. 4B, after a substrate 10, a first n-type semiconductor layer 20, a mask layer 30, a nanostructure 40, a first electrode 50, an insulation layer 60, and a second electrode 70 are formed as illustrated in FIG. 2G described above, a reflective layer 80 may be formed on the second electrode 70. Specifically, when a light having a predetermined energy is emitted by the recombination of electron and hole in an active layer included in the nanostructure 40, the light reflected by the reflective layer 80 is emitted only through the transparent sapphire substrate 10 and thus, the extraction efficiency of light may increase. Meanwhile, bump bonding and flipchip bonding may be used in a flipchip process, but specific process and method are a well-known technique and thus, detailed description will not be provided herein.

In an example embodiment, an n-type pad 51 and a p-type pad 71 are formed on each of the first electrode 50 and the second electrode 70. Each of the n-type pad 51 and the p-type pad 71 may be coupled with the package substrate 100, i.e., the bumps on the backplane. As the n-type pad 51 and the p-type pad 71 are coupled with the bump, the first electrode 50 and the second electrode 70 may inject electrons and holes into the nanostructure 40. Meanwhile, the n-type pad 51 and the p-type pad 71 may be formed on an edge of the light emitting diode 1000. For example, as illustrated in FIG. 4A, the n-type pad 51 may be formed on the upper right end of the bottom view and the p-type pad 71 may be disposed on the lower left end. However, this is only an example, and the n-type pad 51 and the p-type pad 71 may be formed on the light emitting diode 1000 as being spaced apart by a predetermined distance, and may be respectively connected to the first electrode and the second electrode.

A fluorescent body 90 may be light emitting materials that absorb energy to emit red, green, and blue light and may be implemented as the quantum dot, or the like. The fluorescent body 90 may be laminated on an upper part of the substrate 10. When the fluorescent body 90 is laminated, the characteristics of the substrate 10 are distinguished. For example, the light emitting diode 1000 may emit light, and the fluorescent body 90 may be laminated on an upper part of the substrate 10 so that it is operated with any one of an R sub pixel, a G sub pixel and a B sub pixel. However, the example is not limited thereto, and the light emitting diode 1000 may emit a blue light, and when the fluorescent body 90 is not laminated, the light emitting diode 1000 may be operated with B sub pixel.

Figure 5A:
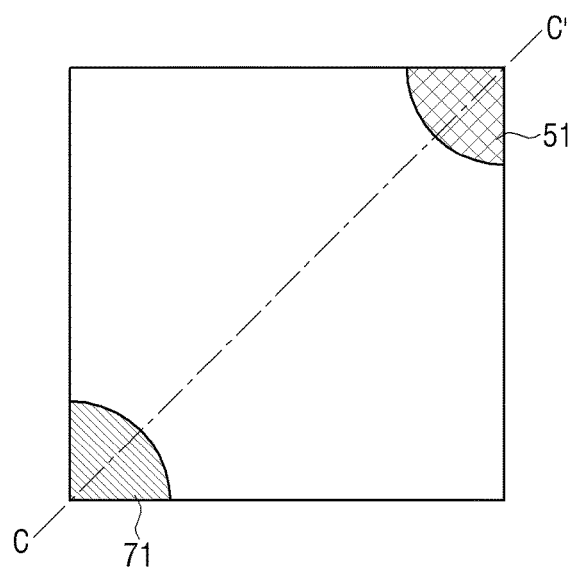
FIGS. 5A and 5B are diagrams illustrating a packaging process of an LED, according to an example embodiment.
Figure 5B:
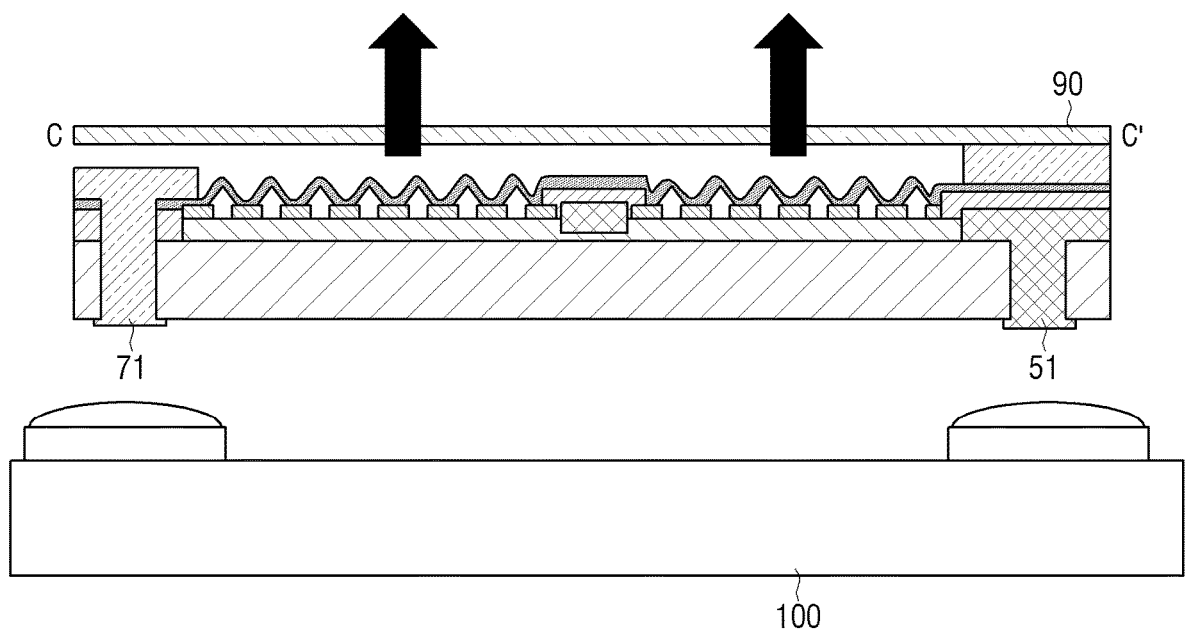

FIGS. 5A and 5B are diagrams illustrating a packaging process of an LED, according to an example embodiment.

As illustrated in FIG. 5B, when the light emitting diode 1000 according to an example embodiment is bonded with the package substrate 100, a top emission method may be applied rather than the bottom emission method illustrated in FIG. 4B. After a substrate 10, a first n-type semiconductor layer 20, a mask layer 30, a nanostructure 40, a first electrode 50, an insulation layer 60 and a second electrode 70 are formed, a first via hole may be formed from the substrate 10 to the first electrode 50 formed in an outer area, and a first pad 51 may be formed in the first via hole. In addition, a second via hole is formed from the substrate 10 to the second electrode 70 formed in an outer area, and a second pad 71 may be formed in the second via hole. Each of the first pad 51 and the second pad 71 may be bonded to a bump of a package substrate. In addition, the first electrode 50 and the second electrode 70 included in the light emitting diode 1000 may be connected to the package substrate 100 using wire bonding.

Figure 6A:
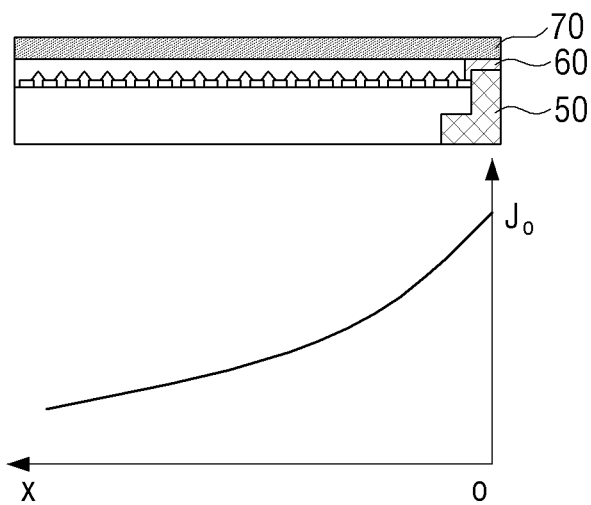
FIGS. 6A and 6B are diagrams illustrating a current crowding effect of an LED, according to an example embodiment.
Figure 6B:
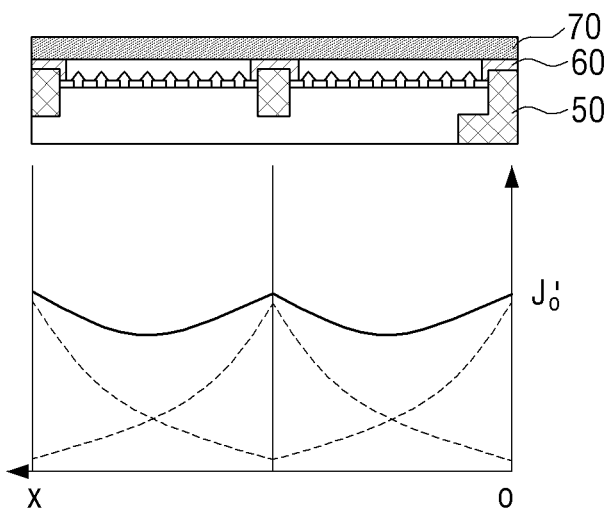

FIGS. 6A and 6B are diagrams illustrating a current crowding effect of an LED, according to an example embodiment.

Referring to FIG. 6A, the first and second electrodes may be formed in only an outer area, and according to an example embodiment, the electrons and the holes cannot be properly combined in the inner region outside the outer region of the light emitting diode. In other words, electrons and holes are injected into the n-type and p-type semiconductors positioned around the first electrode 50 and second electrode 70, thereby causing a current over-crowding effect. As illustrated in the graph of FIG. 6A, the charge injection $J_0$ decreases exponentially in the n-type and p-type semiconductors located at a distance from the first and second electrodes. As a result, the luminous efficiency may decrease depending on the overall region of the light emitting region of the light emitting diode.

However, referring to FIG. 6B, which illustrates a structure and luminance efficiency of a light emitting diode, according to an example embodiment of the present disclosure, the first electrode 50 and second electrode 70 may be formed in an outer region and an inner region other than the outer region of the light emitting diode. According to an example embodiment, the electrons and holes injected into the n-type semiconductor and the p-type semiconductor through the first and second electrodes are not concentrated in the outer region, and may be uniformly injected into the inner region. Accordingly, the current crowding effect may be relatively improved compared with existing light emitting diode. In other words, the local heat generation phenomenon can be improved and the luminous efficiency can be increased. The $J_0'$ illustrated in the graph of FIG. 6B refers to a current distribution within the light emitting diode, and it can be seen that $J_0'$ is maintained at a predetermined level throughout the light emitting region of the light emitting diode.

Figure 7:
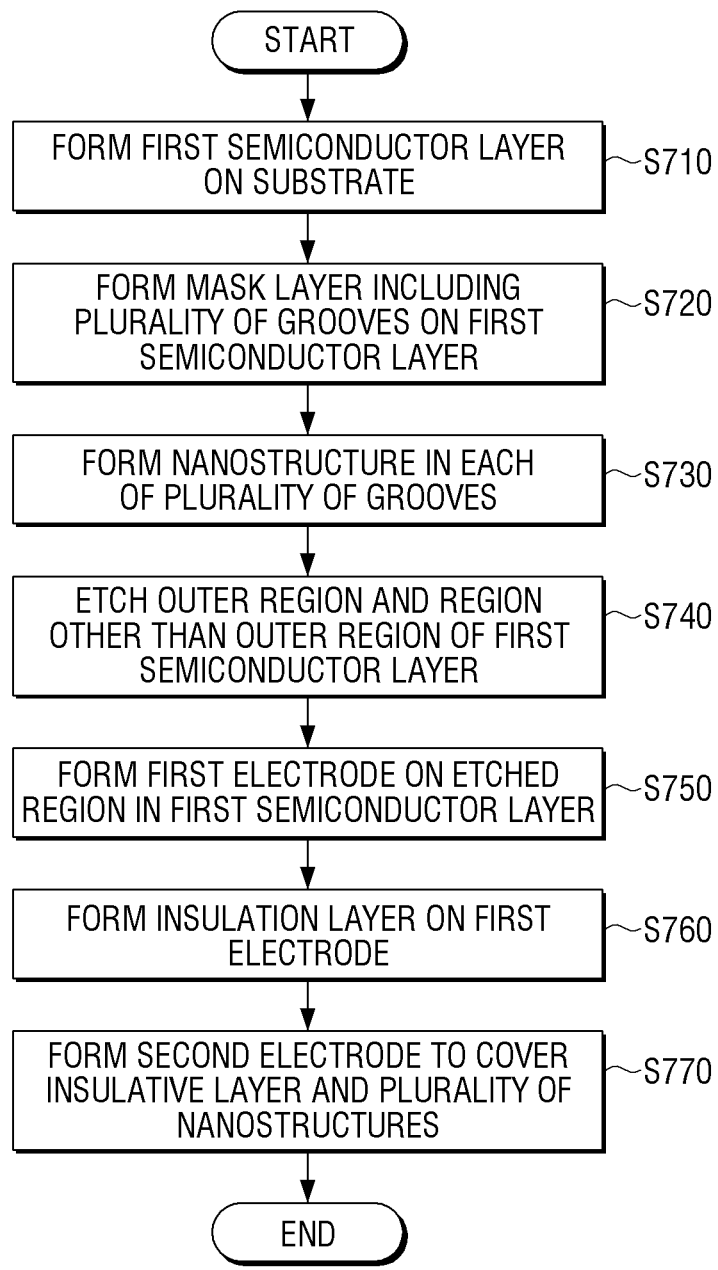
FIG. 7 is a flowchart illustrating a method of manufacturing an LED, according to an example embodiment.

FIG. 7 is a flowchart illustrating a method of manufacturing an LED, according to an example embodiment.

First, a first semiconductor layer is formed on a substrate, at operation S710. In addition, a mask layer including a plurality of grooves is formed on the first semiconductor layer, at operation S720. In addition, a nanostructure is formed in each of the plurality of grooves, at operation S730. In addition, an outer region and a region outside the outer region of the first semiconductor layer are etched at operation S740. In addition, a first electrode is formed on the etched region in the first semiconductor layer, at operation S750. In addition, an insulation layer is formed on the first electrode, at operation S760. In addition, a second electrode is formed to cover the insulation layer and a plurality of nanostructures, at operation S770.

According to an example embodiment, a region other than the outer region may be a horizontal line region and vertical line region which are connected to the outer region by passing through the center portion of the inner region outside the outer region.

In addition, a region other than the outer region may include a rectangular region having four sides longer than the width of the horizontal line region and the vertical line region based on the center portion.

Meanwhile, a nanostructure may include a plurality of nano-shaped second n-type semiconductors, a plurality of active layers respectively formed on the plurality of second n-type semiconductors, and a plurality of p-type semiconductors formed in each of the plurality of active layers.

According to an example embodiment, the plurality of active layers may be formed to cover each of the plurality of second n-type semiconductors, and the plurality of p-type semiconductors may be formed to cover each of the plurality of active layers.

Meanwhile, the manufacturing method may further include forming a reflective layer on the second electrode.

In addition, the manufacturing method may further include forming a first via hole on a substrate to connected with at least a portion of the first electrode formed in the outer region, forming a first pad in the first via hole, forming a second via hole on the substrate to connect with at least a portion spaced apart from the electrode from among the second electrode formed in the outer region, and forming a second pad in the second via hole.

According to an example embodiment, an area of the insulation layer may be larger than or equal to that of the first electrode.

The foregoing example embodiments and advantages are merely exemplary and are not to be construed as limiting the present invention. The present teaching can be readily applied to other types of apparatuses. Also, the description of the example embodiments is intended to be illustrative, and not to limit the scope of the claims, and many alternatives, modifications, and variations will be apparent to those skilled in the art.

What is claimed is:

1. A light emitting diode, comprising:
   a substrate;
   a first n-type semiconductor layer formed on the substrate;
   a first electrode formed in an outer region of the first n-type semiconductor layer and formed in an inner region of the first n-type semiconductor layer different from the outer region;
   a plurality of nano-shaped second n-type semiconductors formed in at least a portion of the first n-type semiconductor layer other than an area in which the first electrode is formed in the first n-type semiconductor layer;
   a plurality of active layers formed on the plurality of nano-shaped second n-type semiconductors;
   a plurality of p-type semiconductors formed on the plurality of active layers;
   an insulation layer formed on the first electrode; and
   a second electrode formed on the insulation layer and the plurality of p-type semiconductors.

2. The light emitting diode as claimed in claim 1, wherein an active layer among the plurality of active layers is formed on each of the plurality of nano-shaped n-type semiconductors, and
   wherein a p-type semiconductor among the plurality of p-type semiconductors is formed on each of the plurality of active layers.

3. The light emitting diode as claimed in claim 1, wherein the second electrode covers the insulation layer and the plurality of p-type semiconductors.

4. The light emitting diode as claimed in claim 1, wherein the inner region comprises at least one of a horizontal line region and a vertical line region which is connected to the outer region by passing through a center portion of a region other than the outer region.

5. The light emitting diode as claimed in claim 4, wherein the inner region comprises a rectangular region having four sides longer than a width of the horizontal line region and the vertical line region based on the center portion.

6. The light emitting diode as claimed in claim 1, wherein the plurality of active layers are formed to cover each of the plurality of nano-shaped n-type semiconductors, and
   wherein the plurality of p-type semiconductors are formed to cover each of the plurality of active layers.

7. The light emitting diode as claimed in claim 1, further comprising:
   a mask layer which is formed between the plurality of nano-shaped n-type semiconductors.

8. The light emitting diode as claimed in claim 1, further comprising:
   a reflective layer which is formed on the second electrode.

9. The light emitting diode as claimed in claim 1, comprising:
   a first pad which is formed in a first via hole of the substrate that is formed to connect with at least a portion of the first electrode formed in the outer region; and
   a second pad which is formed in a second via hole of the substrate that is formed to connect with at least an outer portion of the second electrode.

10. The light emitting diode as claimed in claim 1, wherein an area of the insulation layer is larger than or equal to an area of the first electrode.

11. The light emitting diode as claimed in claim 1, wherein
   the insulation layer is formed directly on the first electrode.

12. The light emitting diode as claimed in claim 1, wherein
   the second electrode is formed above the first electrode.

13. The light emitting diode as claimed in claim 1, wherein
   the second electrode is formed above the first electrode.

14. A light emitting diode, comprising:
   a semiconductor layer formed on a substrate;
   a plurality of mask elements formed on the semiconductor layer, the plurality of mask elements spaced apart from each other to form a plurality of openings;
   a plurality of nanostructures formed in the plurality of openings, respectively;
   a first electrode formed in an etched region of the semiconductor layer, the etched region comprising an outer region of the semiconductor layer and the first electrode formed in an inner region inside a boundary formed by the outer region;
   an insulation layer formed on the first electrode; and
   a second electrode formed on the insulation layer and the plurality of nanostructures.

15. The light emitting diode as claimed in claim 14, wherein
   the insulation layer is formed directly on the first electrode.

* * * * *